(12) United States Patent
Chen et al.

(10) Patent No.: US 8,536,684 B2
(45) Date of Patent: Sep. 17, 2013

(54) METHOD OF ASSEMBLING SHIELDED INTEGRATED CIRCUIT DEVICE

(75) Inventors: Wei Min Chen, Tianjin (CN); Zhigang Bai, Tianjin (CN); Zhijie Wang, Tianjin (CN)

(73) Assignee: Freescale Semiconductor. Inc, Austin, TX (US)

( * ) Notice: Subject to any disclaimer, the term of this patent is extended or adjusted under 35 U.S.C. 154(b) by 215 days.

(21) Appl. No.: 13/092,162

(22) Filed: Apr. 22, 2011

(65) Prior Publication Data
US 2012/0018858 A1    Jan. 26, 2012

(30) Foreign Application Priority Data

Jul. 21, 2010 (CN) .......................... 2010 1 0236800

(51) Int. Cl.
*H01L 23/29* (2006.01)

(52) U.S. Cl.
USPC ............................................ 257/659; 29/841

(58) Field of Classification Search
USPC .............................. 29/832, 841; 257/659, 706
See application file for complete search history.

(56) References Cited

U.S. PATENT DOCUMENTS

| | | | |
|---|---|---|---|
| 5,166,772 A | 11/1992 | Soldner et al. | |
| 5,294,826 A | 3/1994 | Marcantonio et al. | |
| 5,436,203 A * | 7/1995 | Lin | ................. 29/841 |
| 5,557,142 A | 9/1996 | Gilmore | |
| 5,679,975 A | 10/1997 | Wyland | |
| 6,054,754 A | 4/2000 | Bissey | |
| 6,211,462 B1 | 4/2001 | Carter | |
| 6,306,526 B1 | 10/2001 | Yamamoto | |
| 6,642,609 B1 | 11/2003 | Minamio | |
| 6,734,552 B2 | 5/2004 | Combs | |
| 7,015,587 B1 | 3/2006 | Poddar | |
| 7,030,469 B2 | 4/2006 | Mahadevan | |
| 2005/0067676 A1* | 3/2005 | Mahadevan et al. | .......... 257/659 |
| 2006/0152913 A1* | 7/2006 | Richey et al. | ................. 361/818 |
| 2008/0265421 A1* | 10/2008 | Brunnbauer et al. | ......... 257/758 |
| 2009/0025211 A1* | 1/2009 | Hiner et al. | .................... 29/832 |

FOREIGN PATENT DOCUMENTS

JP          10-284873          10/1998

* cited by examiner

*Primary Examiner* — Thomas L Dickey
(74) *Attorney, Agent, or Firm* — Charles Bergere

(57) ABSTRACT

A method of assembling an integrated circuit (IC) device includes the steps of providing a lead frame or substrate panel, attaching a semiconductor die to the lead frame or substrate panel and electrically coupling the die to the lead frame or substrate panel. The method further includes encapsulating the die with a first encapsulant, and the encapsulating the first encapsulant with a second encapsulant where the second encapsulant includes a material that provides electromagnetic shielding.

12 Claims, 8 Drawing Sheets

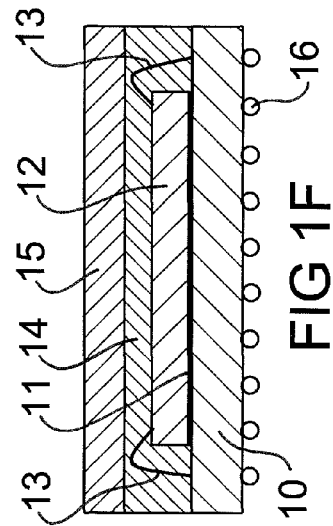
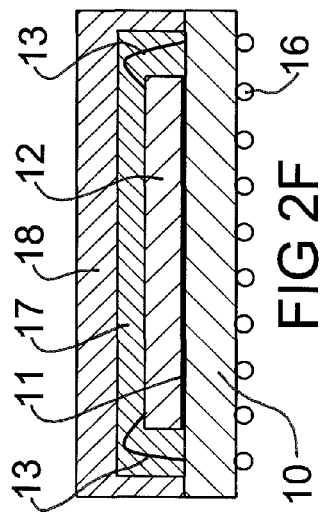
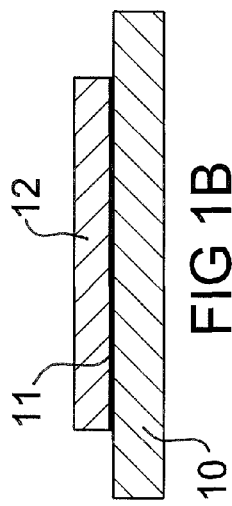
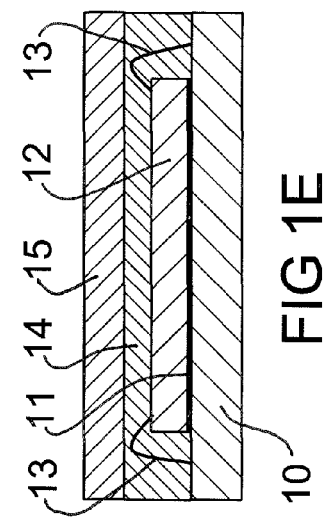
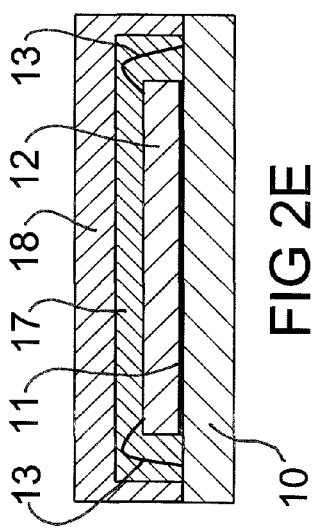
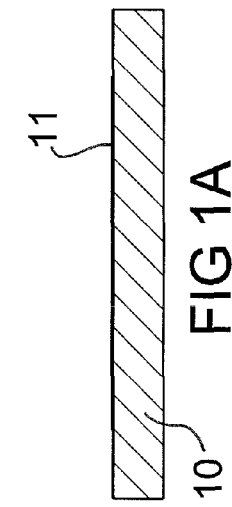
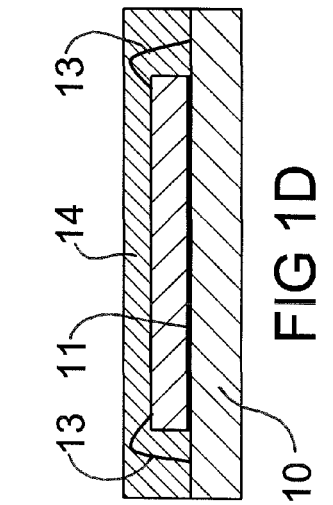

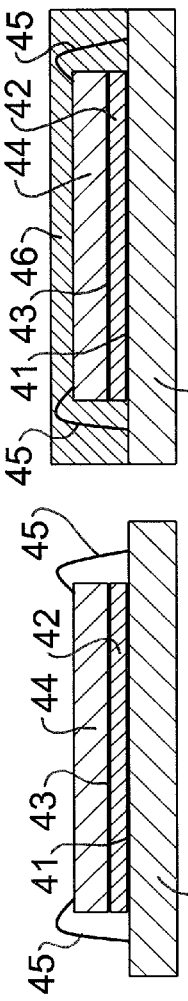
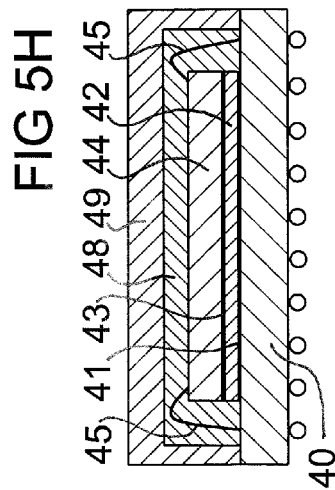

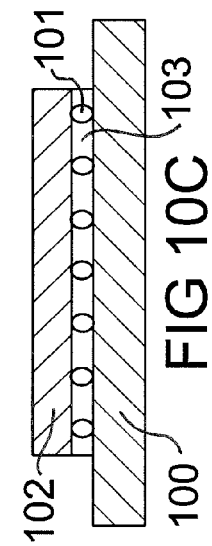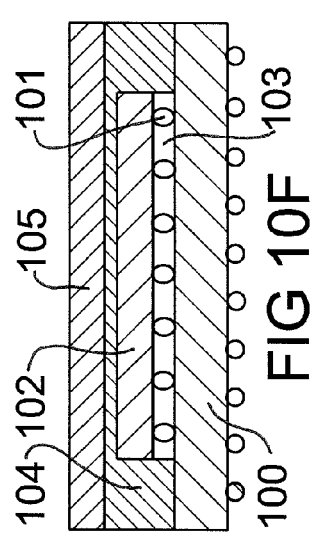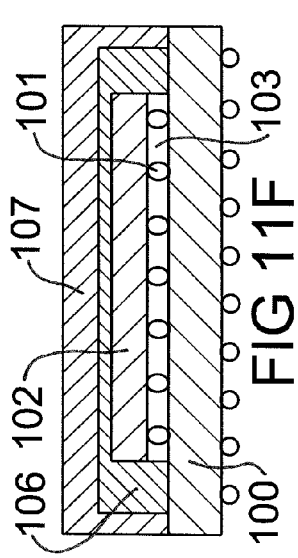
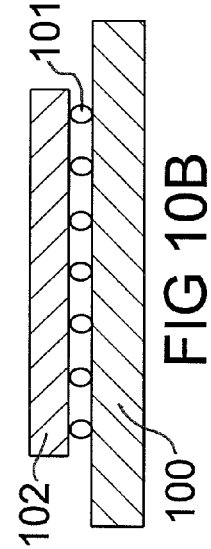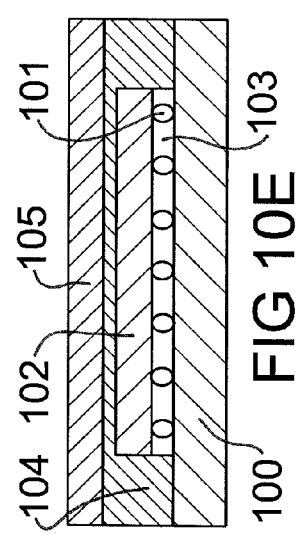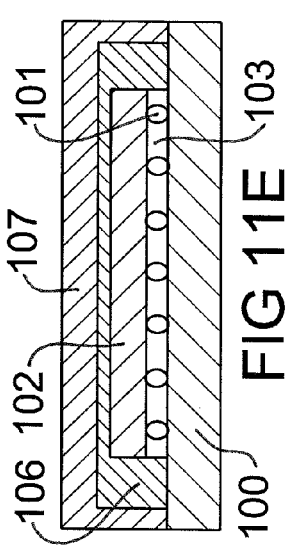
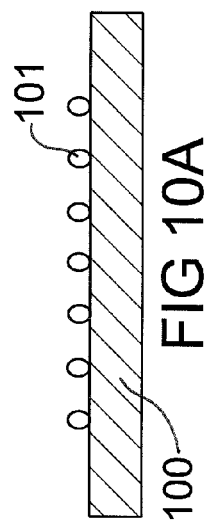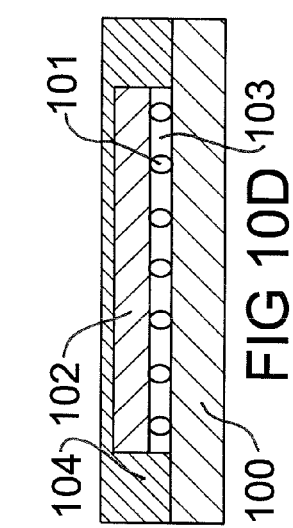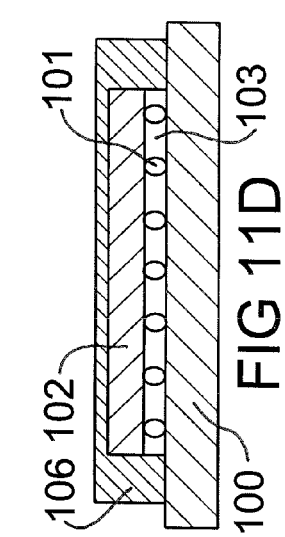

US 8,536,684 B2

METHOD OF ASSEMBLING SHIELDED INTEGRATED CIRCUIT DEVICE

BACKGROUND OF THE INVENTION

This application is related to currently pending U.S. patent application Ser. No. 11/576,152 filed Mar. 28, 2007.

The present invention relates to an integrated circuit (IC) device and in particular relates to a method of protecting the IC device from an external environment including electromagnetic interference (EMI) or radio frequency interference (RFI).

Integrated circuit devices such as magnetic random access memory (MRAM) may be subject to error in the presence of stray or externally applied electromagnetic fields other than applied write fields. Such stray fields can originate from a variety of sources including electronic devices such as computers, displays, etc. and may have sufficient magnitude to switch the logic state of one or more memory cells even in the absence of a write field.

Integrated circuit devices are commonly protected from the external environment by encapsulation with an epoxy material or transfer molding a thermoplastic resin around the device. However, the epoxy or plastic encapsulent does not provide effective shielding from radiation such as EMI or RFI.

Some conventional shielding systems use a conductive metallic enclosure that surrounds the circuit to be shielded. Other systems use magnetic foils to shield the device from magnetic fields. However, all of the known solutions have some draw-backs. For instance use of a conductive metal enclosure adds to the overall size of the package and requires an additional soldering process to attach the enclosure to the device with heat generated by the additional soldering process potentially damaging the device. Use of magnetic foils on the other hand gives rise to serious interface delamination issues particularly when double foils are used in a cladding structure.

Therefore a need exists for a cost effective component level shielding process that can be used in a variety of circuit devices with any semiconductor die size.

BRIEF DESCRIPTION OF THE DRAWINGS

Preferred embodiments of the present invention will be described with reference to the accompanying drawings wherein:

FIGS. 1A to 1F show an enlarged cross-sectional view of an IC device at different stages of assembly prior to singulation in accordance with one embodiment of the present invention;

FIGS. 2D to 2F show an enlarged cross-sectional view of an IC device in accordance with another embodiment of the present invention;

FIGS. 4A to 4H show an enlarged cross-sectional view of an IC device at different stages of assembly prior to singulation in accordance with a further embodiment of the present invention;

FIGS. 5F to 5H show an enlarged cross-sectional view of an IC device in accordance with a further embodiment of the present invention;

FIGS. 10A to 10F show an enlarged cross-sectional view of an IC device at different stages of assembly prior to singulation in accordance with a further embodiment of the present invention;

FIGS. 11D to 11F show an enlarged cross-sectional view of an IC device in accordance with a further embodiment of the present invention.

DESCRIPTION OF A PREFERRED EMBODIMENT

Figure 3:
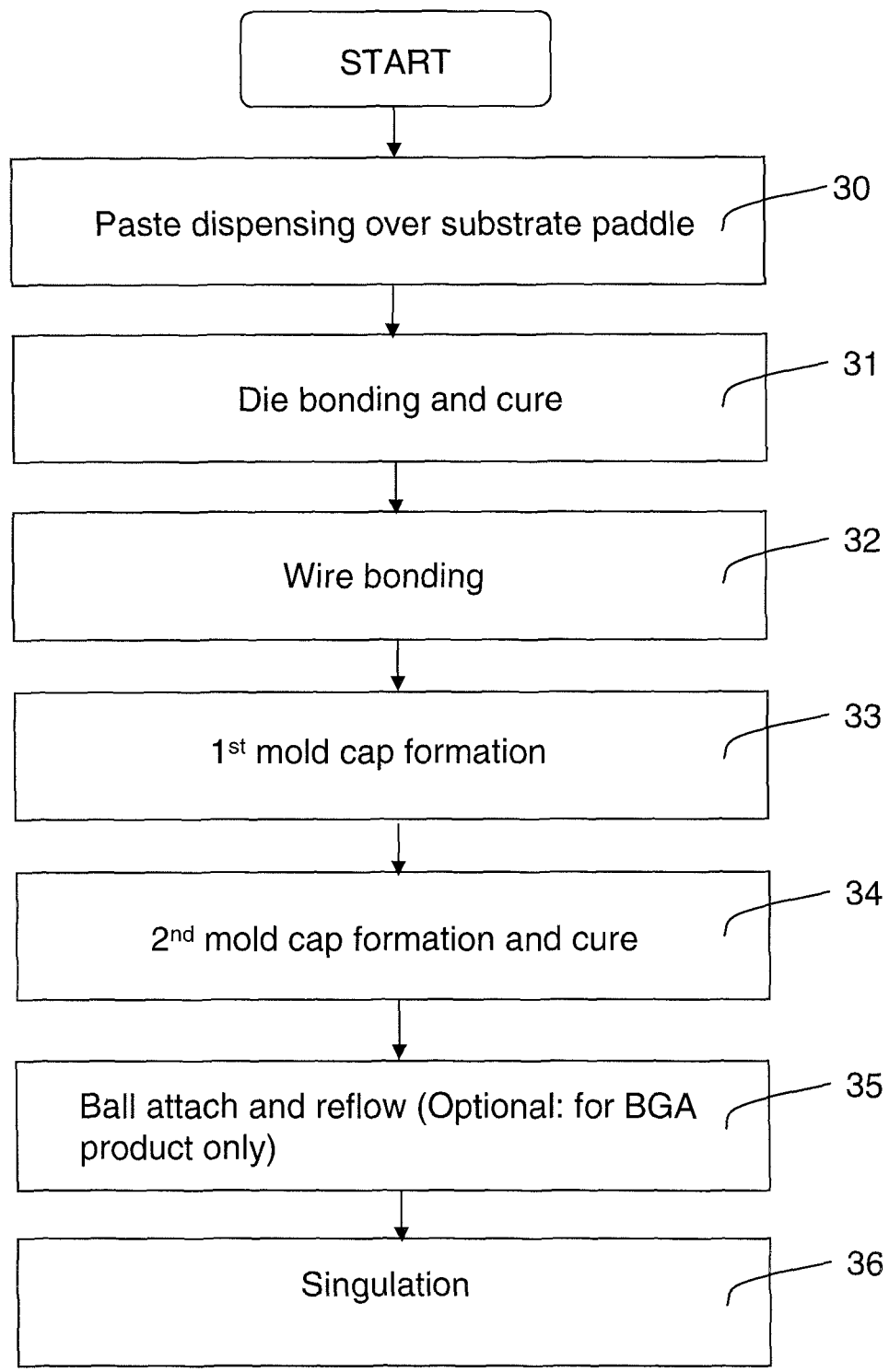
FIG. 3 is a flow chart illustrating a method of assembling an IC device in accordance with an embodiment of the present invention.

According to one aspect of the present invention there is provided a method of forming an integrated circuit (IC) device including the steps of: (i) providing a lead frame or substrate panel; (ii) attaching a semiconductor die to the lead frame or substrate panel; (iii) electrically coupling the semiconductor die to the lead frame or substrate panel; (iv) encapsulating the semiconductor die with a first encapsulant; and (v) encapsulating the first encapsulant with a second encapsulant wherein said second encapsulant includes a material that provides at least an electromagnetic shielding function.

Preferably the first encapsulant does not provide a magnetic shielding function. The first encapsulant may include a molding compound such as Hitachi 9200 HF10M compound or Sumitomo G700 compound. The first encapsulant may be applied by means of an MAP molding process or alternatively, by means of a mold tool including an individual cavity for each mold cap.

The second encapsulant may include conductive material and/or metal particles for providing electric shielding for the IC device. The second encapsulant may include non-conductive magnetic particles for providing magnetic shielding for the IC device. The second encapsulant may be applied by means of an MAP molding process or, alternatively, by means of a mold tool including an individual cavity for each mold cap. Further, the second encapsulant should cover at least a top and two side surfaces of the first encapsulant.

The substrate may include a Printed Circuit Board (PCB). The step of electrically coupling to the lead frame or substrate may be performed by wire bonding. Alternatively the step of electrically coupling to the lead frame or substrate may be performed by a flip chip process.

According to another aspect of the present invention there is provided an integrated circuit (IC) device including a lead frame or substrate panel; a semiconductor die attached and electrically coupled to the lead frame or substrate panel; a first encapsulant applied over the semiconductor die; and a second encapsulant applied over the first encapsulant. The second encapsulant covers a top surface and both sides of the first encapsulant. In addition, the second encapsulant includes a material that provides electromagnetic shielding.

Referring now to FIG. 1A a substrate or lead frame panel 10 represents one panel in a strip or array of such panels (not shown) before singulation. The panel 10 may include a Bismaleimide Triazine (BT) substrate. A BT substrate is suitable for Ball Grid Array (BGA) products. Alternatively the panel 10 may include a metal substrate such as Alloy 42 or plated copper, plated aluminium, plated plastics or the like. Plated materials may include copper, silver or multi-layer plating such as nickel-palladium and gold. The panel 10 may be configured to be compatible with standard IC packaging assembly tools.

A layer of adhesive paste 11 such as high conductivity epoxy material is applied to a site on panel 10, known as a flag or die attach paddle, as shown in FIG. 1A. After being cut from a semiconductor wafer a semiconductor die 12 is placed on a respective layer of adhesive paste 11 as shown in FIG. 1B using a pick and place tool as is known in the art. The adhesive paste 11 is subsequently cured as is known in the art.

Following curing of the adhesive paste 11, the semi-conductor die 12 is electrically coupled to lead fingers or substrate pads (not shown) on the panel 10 via wires 13 as shown in FIG. 1C. The wires 13 are formed from a conductive material such as aluminium or gold. In one embodiment, the wires 13 are stitch bonded to the lead fingers using commercially available wire-bonding equipment.

After the wires 13 are bonded to the die 12, a first or primary mold encapsulation process is performed to form a mold cap or encapsulant 14 over the die 12 and wires 13 as shown in FIG. 1D. The primary encapsulation process may include a MAP (mold array package) molding process performed via molding apparatus such as a transfer molding device.

The encapsulant 14 preferably includes a composite material that does not provide electro-magnetic shielding. The encapsulant 14 may include materials including epoxy resins, phenolic hardeners, silicas, catalysts, pigments and mold release agents. Alumina instead of silica may be used as a filler when a higher thermal conductivity is desired. For example the encapsulant 14 may comprise a Hitachi 9200 HF10M compound or a Sumitomo G700 compound, both of which are commercially available.

After the primary mold encapsulation process is completed, a secondary mold encapsulation process is performed to form a mold cap or second encapsulant 15 over the first encapsulant 14 as shown in FIG. 1E. The second encapsulant 15 includes a composite material that provides at least an electro-magnetic shielding function.

The second encapsulant 15 may include additives such as conductive/metal particles to provide electromagnetic shielding for the device. The latter may provide electric shielding to block an electromagnetic field. Alternatively or additionally, the second encapsulant 15 may include non-conductive magnetic particles such as perovskite or zinc ferrite. The latter may perform magnetic shielding by drawing a magnetic field into the particles to provide a path for magnetic field lines around a shielded volume.

The secondary encapsulation process may be performed by means of a conventional molding apparatus as described above (e.g., MAP). In a case of a BGA (Ball Grid Array) type device, the secondary encapsulation process may be followed by a ball attach process as shown in FIG. 1F. In the ball attach process, solder balls 16 are attached to a bottom surface of the substrate and then the solder balls 16 permit the device to be attached to a printed circuit board (PCB). The attach process may be performed in a reflow oven or by means of an infrared heater that causes the solder balls 16 to melt.

Following the second encapsulation process, individual devices are singulated or separated from the molded array assembly using saw singulation or similar techniques known in the art. For a BGA type device, the solder balls 16 may be attached either before or after the singulation process.

In some embodiments, the first and second mold encapsulation processes shown in FIGS. 1D to 1F may be modified as shown in FIGS. 2D to 2F. The process shown in FIG. 2D is similar to the process shown in FIG. 1D except that a first encapsulant 17 is produced by means of a traditional mold tool, which uses an individual cavity for each device.

The process shown in FIG. 2E is also similar to the process shown in FIG. 1E except that the second encapsulant 18 is produced by means of a MAP process or mold tool including an individual cavity for device. In addition, the second encapsulant 18 covers the top and two side surfaces of the first encapsulant 17 and the sides of the second encapsulant contact the top of the panel 10.

FIG. 2F shows an optional BGA attach process on a device whose first encapsulant is molded with an individual cavity that corresponds to the process described in connection with FIG. 1F.

A flow chart associated with the process shown in FIGS. 1A to 1F (or FIGS. 1A to 1C and 2D to 2F) is shown in FIG. 3. Step 30 in FIG. 3 corresponds to the paste dispensing step described with reference to FIG. 1A. Step 31 corresponds to the die bonding step described with reference to FIG. 1B and step 32 corresponds to the wire bonding step described with reference to FIG. 1C. Step 33 corresponds to the first or primary mold encapsulation process described with reference to FIG. 1D (or FIG. 2D) and step 34 corresponds to the secondary mold encapsulation process described with reference to FIG. 1E (or FIG. 2E). Step 35 corresponds to the optional BGA attach process described with reference to FIG. 1F (or FIG. 2F) and step 36 corresponds to the singulation step also described with reference to FIG. 1F (or FIG. 2F). Again, it should be noted that for BGA devices the solder balls may be attached either before of after the singulation step.

Referring now to FIG. 4A, a substrate or lead frame panel 40 represents one panel in a strip or array of such panels (not shown) before singulation. The panel 40 may be similar in construction and composition to the panel 10 described above.

A first layer 41 of adhesive paste is applied to a die attach paddle on the panel 40 as shown in FIG. 4A. A layer of electro-magnetic shielding foil 42 is applied to the layer of adhesive paste 41 in any suitable manner and by any suitable means. A second layer of adhesive paste 43 is applied to the shielding foil 42 as shown in FIG. 4C.

A semiconductor die 44 is placed on a respective second layer of adhesive paste 43 as shown in FIG. 4D using a pick and place tool as described above. Following curing of the adhesive pastes each semiconductor die 44 is electrically coupled to lead fingers (not shown) on the panel 40 via wires 45 as shown in FIG. 4E using commercially available wire-bonding equipment as described above.

After the wires 45 are bonded to the die 44 a first mold encapsulation process is performed to form a first mold cap or encapsulant 46 over the die 44 and wires 45 as shown in FIG. 4F. The first encapsulant 46 may be similar in composition to the first encapsulant 14 described above in that it preferably does not provide an electro-magnetic shielding function.

After the primary mold encapsulation process is completed a secondary mold encapsulation process is performed to form a second mold cap or encapsulant 47 over the first encapsulant 46 as shown in FIG. 4G. The second encapsulant 47 may be similar in composition to the second encapsulant 15 described above in that it preferably provides at least an electro-magnetic shielding function.

In the case of a BGA product the secondary mold encapsulation process may be followed by a ball attach process as shown in FIG. 4H.

Following the secondary mold encapsulation process, individual devices are formed by singulating the devices one from another.

In some embodiments the primary and secondary mold encapsulation processes shown in FIGS. 4F to 4H may be modified as shown in FIGS. 5F to 5H. The process shown in FIG. 5F is similar to the process shown in FIG. 4F except that a first encapsulant 48 is produced by means of a traditional mold tool by using an individual cavity for each device.

The process shown in FIG. 5G is also similar to the process shown in FIG. 4G except that a second encapsulant 49 is formed by means of a MAP process or mold tool including an individual cavity for each mold cap.

FIG. 5H shows an optional BGA attach process on a product whose first encapsulant is molded with an individual cavity that corresponds to the process described in connection with FIG. 4H.

Figure 6:
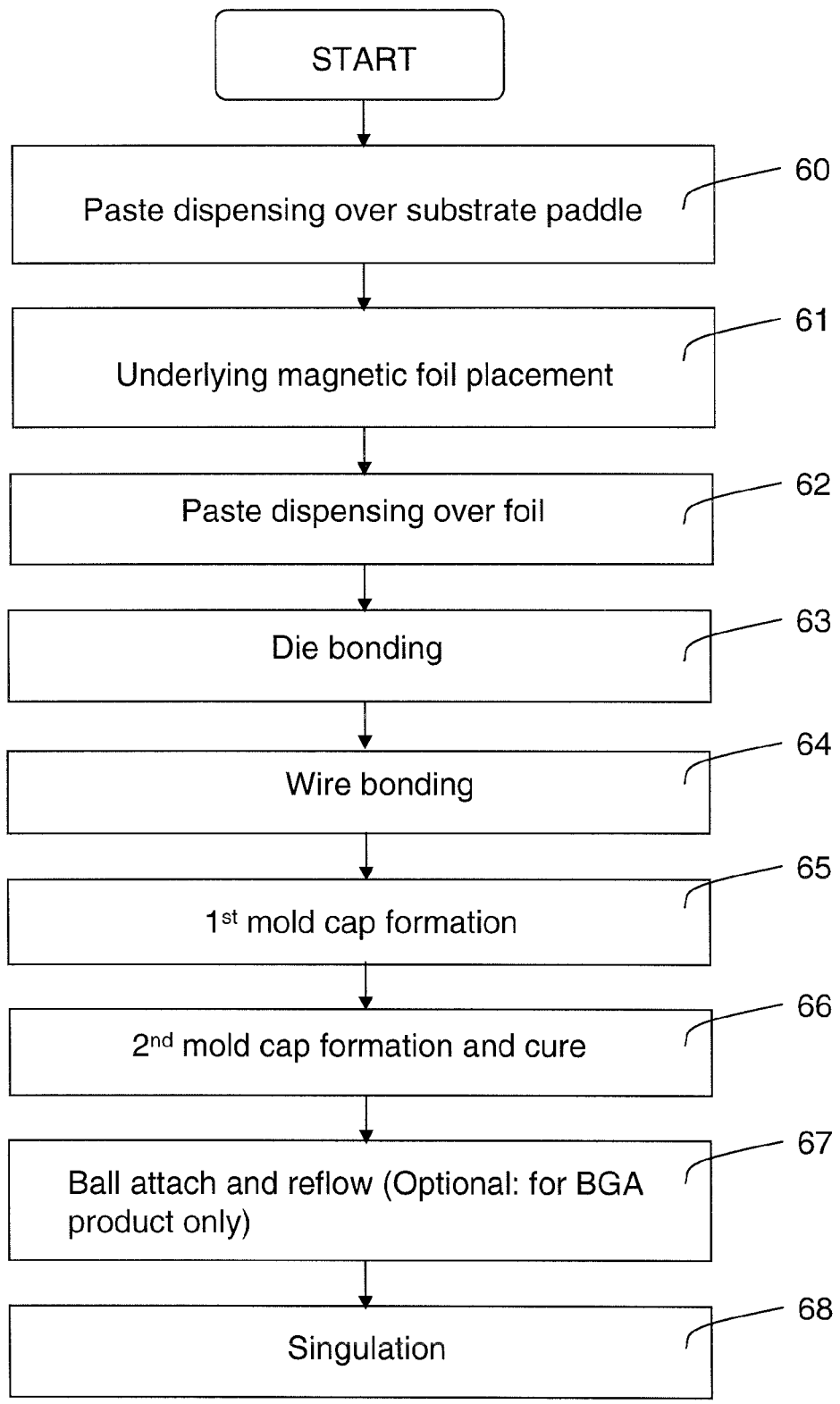
FIG. 6 is a flow chart illustrating another method of assembling an IC device in accordance with an embodiment of the present invention.

A flow chart associated with the process shown in FIGS. 4A to 4H (or FIGS. 4A to 4E and FIGS. 5F to 5H) is shown in FIG. 6. Step 60 in FIG. 6 corresponds to the first paste dispensing step described with reference to FIG. 4A. Step 61 corresponds to magnetic foil placement described with reference to FIG. 4B and step 62 corresponds to the second paste dispensing step described with reference to FIG. 4C. Step 63 corresponds to the die bonding step described with reference to FIG. 4D and step 64 corresponds to the wire bonding step described with reference to FIG. 4E. Step 65 corresponds to the first or primary mold encapsulation process described with reference to FIG. 4F (or FIG. 5F) and step 66 corresponds to the secondary mold encapsulation process described with reference to FIG. 4G (or FIG. 5G). Step 67 corresponds to the BGA attach process described with reference to FIG. 4H (or FIG. 5H) and step 68 corresponds to the singulation step also described with reference to FIG. 4H (or FIG. 5H).

Figure 7A:
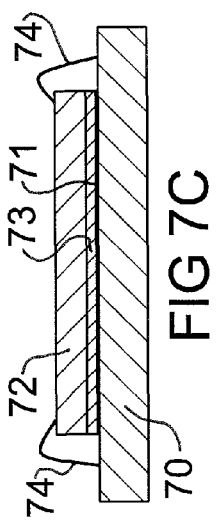
FIGS. 7A to 7F show an enlarged cross-sectional view of and IC device at different stages of assembly prior to singulation in accordance with a further embodiment of the present invention.

Referring now to FIG. 7A substrate or lead frame panel 70 represents one panel in a strip or array of such panels (not shown) before singulation. The panel 70 may be similar in construction and composition to the panels 10 and 40 described above.

Figure 7B:
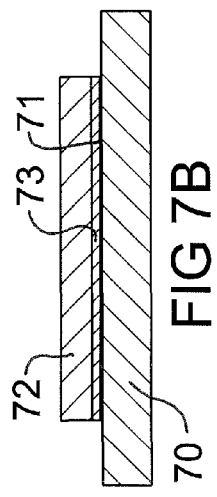
Figure 7C:
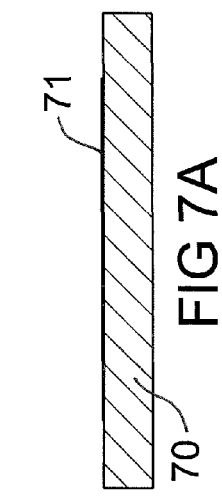

A first layer 71 of adhesive paste is applied to a die attach paddle on the panel 70 as shown in FIG. 7A. A semiconductor die 72 with a magnetic metallization 73 at its bottom layer is placed on a respective layer of adhesive paste 71 as shown in FIG. 7B using a pick and place tool as described above. Following curing of the adhesive paste 71 each semiconductor die 72 is electrically coupled to lead fingers (not shown) on the panel 70 via wires 74 as shown in FIG. 7C using commercially available wire-bonding equipment as described above.

Figure 7D:
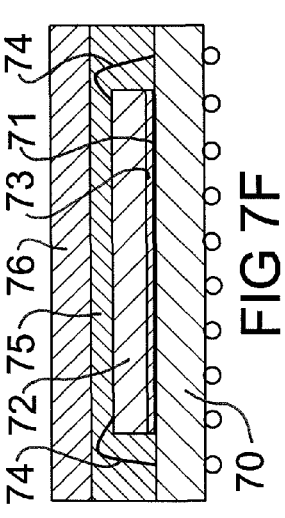

After the wires 74 are bonded to die 72 a primary mold encapsulation process is performed to form a first mold cap or encapsulant 75 over the die 72 and wires 74 as shown in FIG. 7D. The first encapsulant 75 may be similar in composition to the first encapsulants 14 and 46 described above in that it preferably does not provide an electro-magnetic shielding function.

Figure 7E:
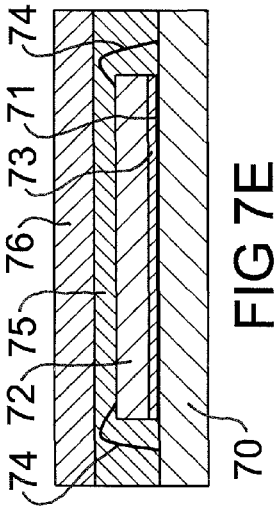

After the primary mold encapsulation process is completed a secondary mold encapsulation process is performed to form a second mold cap or encapsulant 76 over the first encapsulant 75 as shown in FIG. 7E. The second encapsulant 76 may be similar in composition to the second encapsulants 15 or 47 described above in that it at least provides an electro-magnetic shielding function.

Figure 7F:
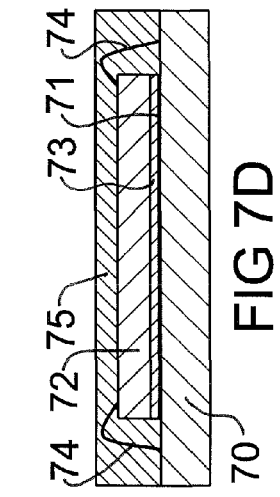

In the case of a BGA product the secondary mold encapsulation process may be followed by a ball attach process as shown in FIG. 7F.

Following the secondary mold encapsulation process (and in the case of a BGA product the ball attach process) individual devices are singulated or separated from the molded array assembly.

Figure 8D:
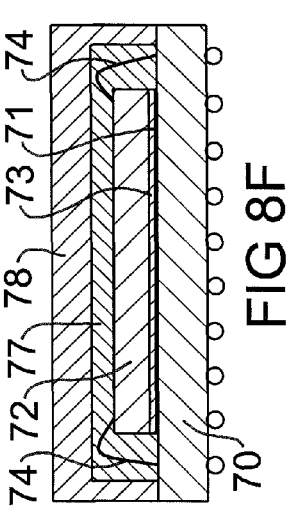
FIGS. 8D to 8F an enlarged cross-sectional view of an IC device in accordance with a further embodiment of the present invention.
Figure 8E:
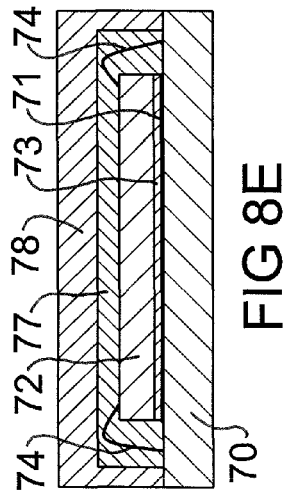
Figure 8F:
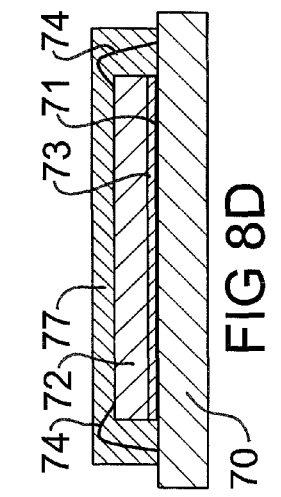

In some embodiments the primary and secondary mold encapsulation process shown in FIGS. 7D to 7F may be modified as shown in FIGS. 8D to 8F. The process shown in FIG. 8D is similar to the process shown in FIG. 7D except that the first encapsulant 77 is produced by means of a traditional mold tool in the form of an individual cavity for each mold cap.

The process shown in FIG. 8E is also similar to the process shown in FIG. 7E except that the second encapsulant 78 may be produced by means of an MAP process or mold tool including an individual cavity for each mold cap.

FIG. 8F shows an optional BGA attach process on a product whose first encapsulant is molded with an individual cavity that corresponds to the process described in connection with FIG. 7F.

Figure 9:
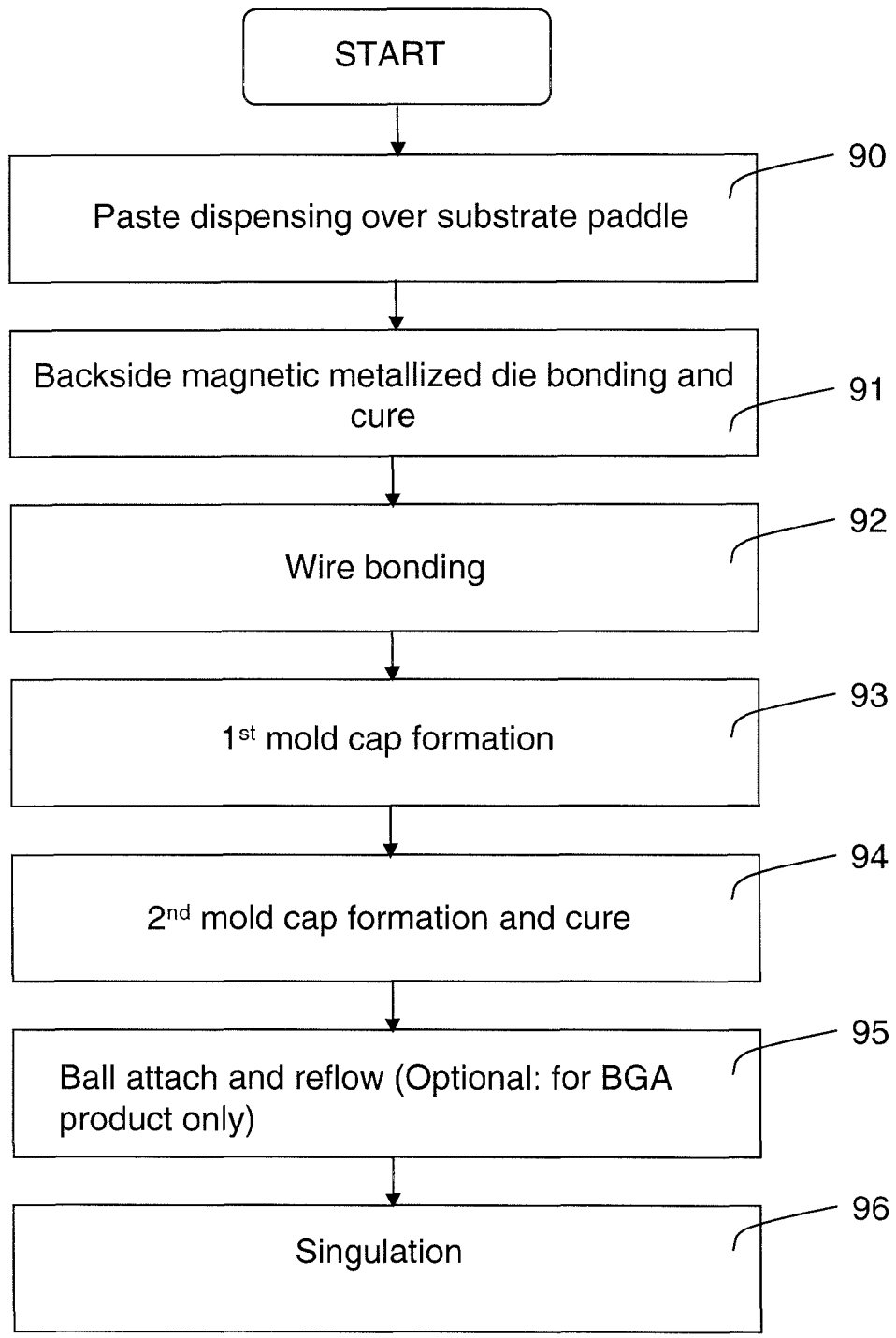
FIG. 9 is a flow chart illustrating a method of assembling an IC device in accordance with an embodiment of the present invention.

A flow chart associated with the process shown in FIGS. 7A to 7F (or FIGS. 7A to 7C and FIGS. 8D to 8F) is shown in FIG. 9. Step 90 in FIG. 9 corresponds to the first paste dispensing step described with reference to FIG. 7A. Step 91 corresponds to the die bonding step described with reference to FIG. 7B and step 92 corresponds to the wire bonding step described with reference to FIG. 7C. Step 93 corresponds to the first or primary mold encapsulation process described with reference to FIG. 7D (or FIG. 8D) and step 94 corresponds to the secondary mold encapsulation process described with reference to FIG. 7E (or FIG. 8E). Step 95 corresponds to the BGA ball attach process described with reference to FIG. 7F (or FIG. 8F) and step 96 corresponds to the singulation step also described with reference to FIG. 7F (or FIG. 8F).

Referring to FIG. 10A, a substrate or lead frame panel 100 represents one panel in a strip or array of such panels (not shown) before singulation. The panel 100 may be similar in composition to the panels 10 and 40 described above.

A semiconductor die 102 with solder balls 101 on its active surface is placed active surface down on the panel 100 as shown in FIG. 10B. The assembly is placed in a reflow oven or exposed to infrared heat, which causes the solder balls to melt and become soldered to the lead fingers.

To address mechanical stress issues, the die bonding and ball attach process is followed by an underfilling process in which an underfill material 103 is injected between the die 102 and the panel 100, as shown in FIG. 10C. The underfill material 103 may be an epoxy mixture as is known in the art. The underfilling process is followed by curing of the underfill material.

After the underfilling process is completed a primary mold encapsulation process is performed to form a first mold cap or encapsulant 104 over the die 102 as shown in FIG. 10D. The first encapsulant 104 may be similar in composition to the first encapsulants 14, 46 and 75 described above in that it preferably does not provide an electro-magnetic shielding function.

After the primary mold encapsulation process is completed a secondary mold encapsulation process is performed to form a second mold cap or encapsulant 105 over the first encapsulant 104 as shown in FIG. 10E. The second encapsulant 105 may be similar in composition to the encapsulants 15, 47 or 76 described above in that it at least provides an electromagnetic shielding function.

In the case of a BGA product the secondary mold encapsulation process may be followed by a ball attach process as shown in FIG. 10F.

Following the secondary mold encapsulation process individual devices are singulated or separated from the molded array assembly.

In some embodiments the primary and secondary mold encapsulation process shown in FIGS. 10D to 10F may be modified as shown in FIGS. 11D to 11F. The process shown in FIG. 11D is similar to the process shown in FIG. 10D except that the first encapsulant 106 is produced by means of a traditional mold tool in the form of an individual cavity for each mold cap.

The process shown in FIG. 11E is also similar to the process shown in FIG. 10E except that the second encapsulant 107 may be produced by means of a MAP process or mold tool including an individual cavity for each mold cap.

FIG. 11F shows an optional BGA attach process on a product whose first encapsulant is molded with an individual cavity that corresponds to the process described in connection with FIG. 10F.

Figure 12:
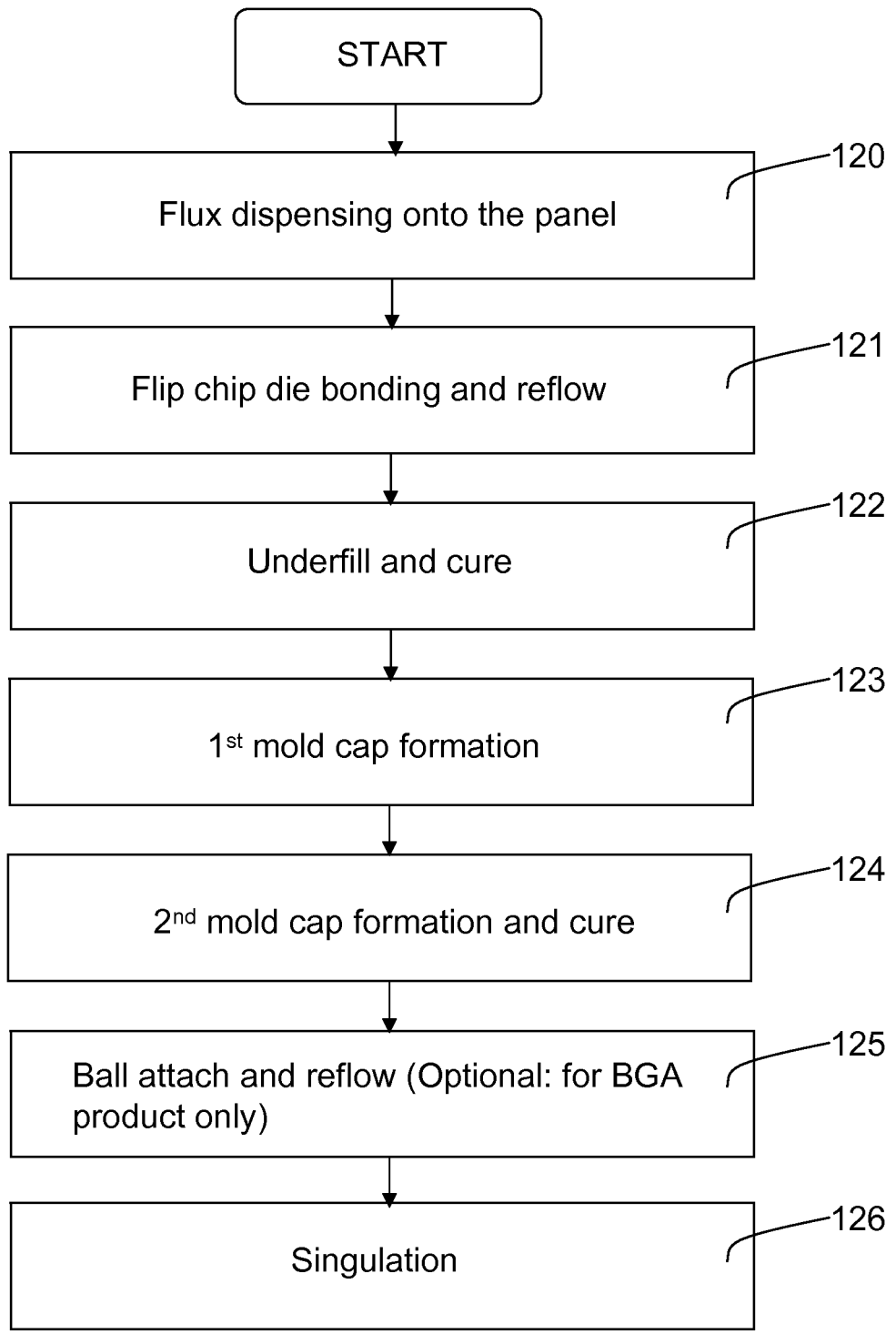
FIG. 12 is a flow chart illustrating a method of assembling an IC device in accordance with yet another embodiment of the present invention.

A flow chart associated with the process shown in FIGS. 10A to 10F (or FIGS. 10A to 10C and FIGS. 11D to 11F) is shown in FIG. 12. Step 120 in FIG. 12 corresponds to flux dispensing described with reference to FIG. 10A. Step 121 corresponds to the flip chip bonding and reflow step described with reference to FIG. 10B and step 122 corresponds to the underfilling and curing step described with reference to FIG. 10C. Step 123 corresponds to the first or primary mold encapsulation process described with reference to FIG. 10D (or FIG. 11D) and step 124 corresponds to the secondary mold encapsulation process described with reference to FIG. 10E (or FIG. 11E). Step 125 corresponds to the BGA attach process described with reference to FIG. 10F (or FIG. 11F) and step 126 corresponds to the singulation step also described with reference to FIG. 10F (or FIG. 11F).

Finally, it is to be understood that various alterations, modifications and/or additions may be introduced into the constructions and arrangements of parts previously described without departing from the spirit or ambit of the invention.

The invention claimed is:

1. An integrated circuit (IC) device, comprising:
   a lead frame or substrate panel;
   a semiconductor die attached and electrically coupled to the lead frame or substrate panel;
   a shield disposed between the bottom surface of the semiconductor die and the lead frame or substrate panel, wherein the shield comprises a magnetic foil;
   a first encapsulant that covers at least a top and two side surfaces of the semiconductor die; and
   a second encapsulant that covers at least a top and two side surfaces of the first encapsulant, wherein said second encapsulant includes a material that provides an electromagnetic shielding function.

2. The IC device of claim 1, wherein the second encapsulant includes conductive material and metal particles for providing electric shielding for the IC device.

3. The IC device of claim 1, wherein the second encapsulant includes non-conductive magnetic particles for providing magnetic shielding for the IC device.

4. The IC device of claim 1, wherein the shield comprises a metal applied to a back side of the semiconductor die before the semiconductor die is attached to the lead frame or substrate panel.

5. A method of assembling an integrated circuit (IC) device including the steps of:
   providing a lead frame or substrate panel;
   attaching a semiconductor die to the lead frame or substrate panel, including shielding a bottom surface of the semiconductor die from the lead frame or substrate panel, wherein the shielding step includes disposing a metal foil between the bottom surface of the semiconductor die and the lead frame or substrate panel;
   electrically coupling the semiconductor die to the lead frame or substrate panel;
   encapsulating the semiconductor die with a first encapsulant, wherein the first encapsulant covers at least a top and two side surfaces of the semiconductor die; and
   encapsulating the first encapsulant with a second encapsulant wherein the second encapsulant includes a material that provides an electromagnetic shielding function, and wherein the second encapsulant covers at least a top and two side surfaces of the first encapsulant.

6. The method of assembling an IC device of claim 5, wherein the second encapsulant includes conductive material and metal particles for providing electric shielding for said IC device.

7. The method of assembling an IC device of claim 5, wherein the second encapsulant includes non-conductive magnetic particles for providing magnetic shielding for said IC device.

8. The method of assembling an IC device of claim 5, wherein the first encapsulant does not provide a magnetic shielding function.

9. The method of assembling an IC device of claim 5, wherein the step of electrically coupling to the lead frame or substrate is performed by wire bonding.

10. The method of assembling an IC device of claim 5, wherein the step of electrically coupling to the lead frame or substrate is performed by a flip chip process.

11. The method of assembling an IC device of claim 5, wherein the first and second encapsulants are applied by means of MAP molding processes.

12. The method of assembling an IC device of claim 5, wherein the first and second encapsulants are applied by means of mold tools, each mold tool including an individual cavity for each mold cap.

* * * * *